(12) United States Patent
Fourezon et al.

(10) Patent No.: US 7,886,686 B2
(45) Date of Patent: Feb. 15, 2011

(54) INSTALLATION FOR THE VACUUM TREATMENT IN PARTICULAR OF SUBSTRATES

(75) Inventors: Gilles Fourezon, Marcilly le Chatel (FR); Jean-Marc Poirson, Saint Etienne le Molard (FR)

(73) Assignee: Tecmachine, Andrezieux Boutheon (FR)

( * ) Notice: Subject to any disclaimer, the term of this patent is extended or adjusted under 35 U.S.C. 154(b) by 422 days.

(21) Appl. No.: 11/044,253

(22) Filed: Jan. 27, 2005

(65) Prior Publication Data
US 2005/0145335 A1 Jul. 7, 2005

Related U.S. Application Data

(63) Continuation of application No. PCT/FR03/02320, filed on Jul. 23, 2003.

(51) Int. Cl.
C23C 16/00 (2006.01)
(52) U.S. Cl. ....................... 118/500; 118/719
(58) Field of Classification Search ............ 156/345.31, 156/345.32, 345.51, 345.54; 118/719, 728, 118/729; 414/939
See application file for complete search history.

(56) References Cited

U.S. PATENT DOCUMENTS 3,973,665 A * 8/1976 Giammanco ................ 198/775
4,666,734 A * 5/1987 Kamiya et al. .............. 427/569
4,824,309 A * 4/1989 Kakehi et al. ................ 414/217
5,538,560 A 7/1996 Zejda et al. .................. 118/730
5,705,044 A * 1/1998 Washburn et al. ...... 204/298.25
5,730,801 A * 3/1998 Tepman et al. .............. 118/719
6,290,824 B1* 9/2001 Ishikawa et al. ....... 204/298.16
6,315,879 B1 11/2001 Washburn et al. ...... 204/298.25
2001/0050224 A1 12/2001 Ishikawa et al. ....... 204/298.16

FOREIGN PATENT DOCUMENTS

| EP | 209408 A1 | * | 1/1987 |
| EP | 0 657 563 A | | 6/1995 |
| JP | 63 028863 A | | 2/1988 |
| JP | 63028863 A | * | 2/1988 |
| JP | 2002 203883 A | | 7/2002 |
| JP | 2002203883 A | * | 7/2002 |

* cited by examiner

*Primary Examiner*—Karla Moore
(74) *Attorney, Agent, or Firm*—Heslin Rothenberg Farley & Mesiti P.C.; Victor A. Cardona, Esq.

(57) ABSTRACT

Installation for vacuum treatment, particularly of substrates, includes several identical independent and aligned modules. Each module is provided with a vacuum treatment chamber and a transfer chamber having a mechanism for transferring a substrate within one of the different chambers or from one chamber to another, the second chamber being located downstream or upstream from, directly next to, or separated by at least one module from the first chamber. A substrate can be transferred into one chamber in order to undergo a treatment while another substrate is placed in a different chamber for a specific treatment.

11 Claims, 4 Drawing Sheets

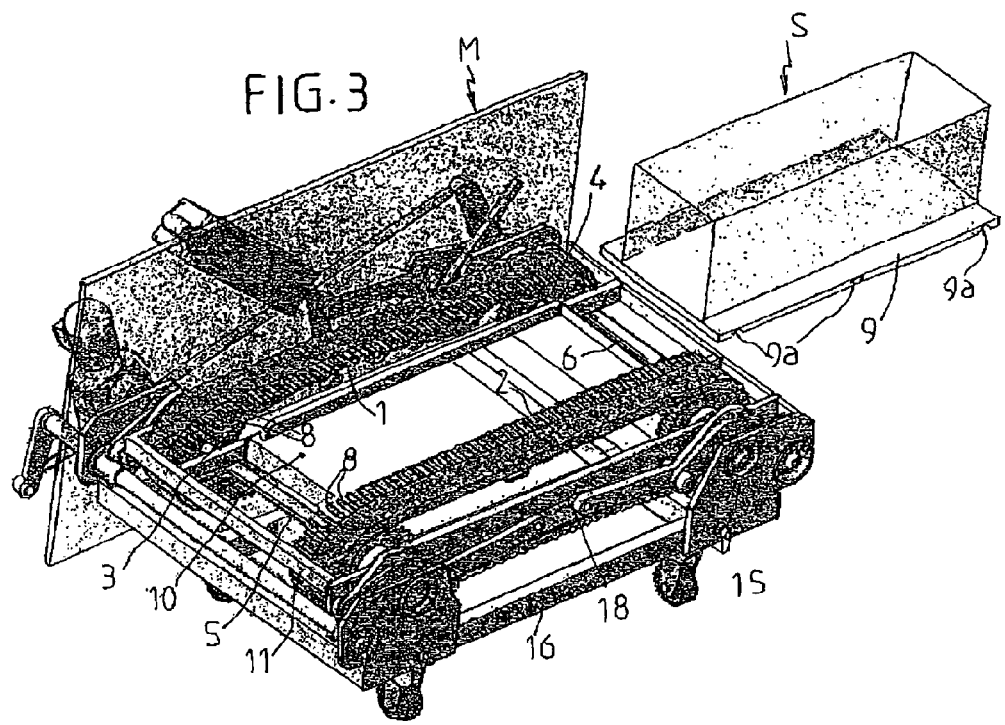
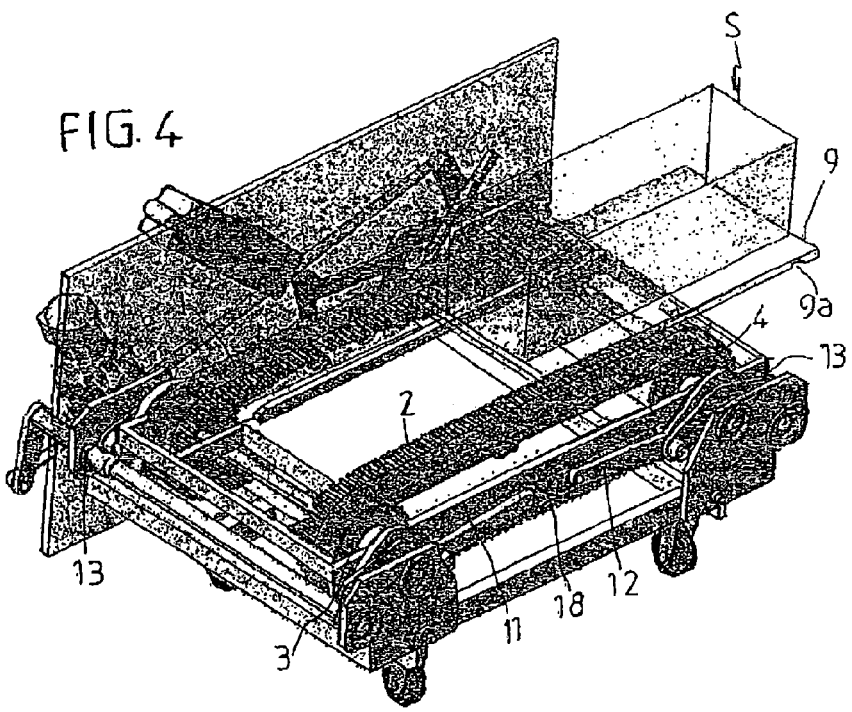

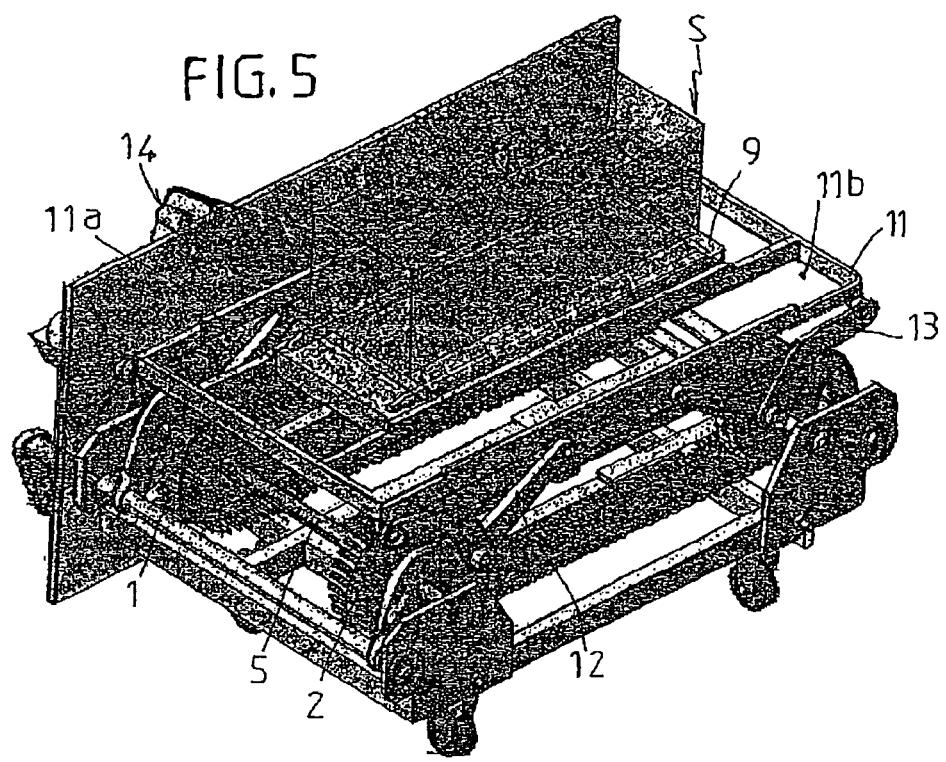
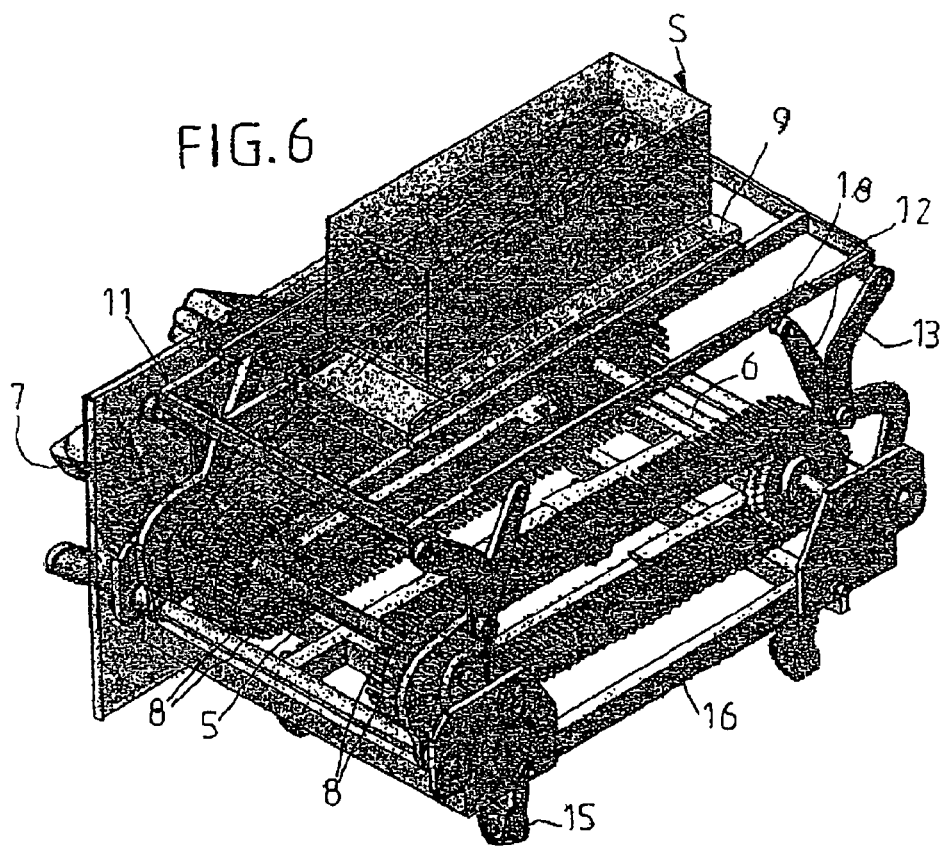

INSTALLATION FOR THE VACUUM TREATMENT IN PARTICULAR OF SUBSTRATES

CROSS REFERENCE TO RELATED APPLICATIONS

This application is a continuation of international application PCT/FR2003/002320 filed on Jul. 23, 2003 and published as international publication number WO 2004/013375 A1, in French, on Feb. 12, 2004, and claims priority from French application number 02.09,955 filed on Aug. 1, 2002, the entire contents of these applications being incorporated herein by reference

FIELD OF THE INVENTION

The invention relates to the technical field of vacuum treatment machines in particular, in the area of vacuum deposition for example.

BACKGROUND ART

More particularly, the problem which the invention is intended to resolve is that of treating large numbers of parts at low cost.

To achieve this object, those skilled in the art have devised what are known as "in-line machines", in which the different successive steps of the deposition process are carried out in dedicated chambers, positioned one after another and connected with valves enabling them to be isolated, so that the parts to be treated pass successively from one enclosure to the next. Generally, the number of enclosures in the sequence is the same as the number of different steps in the process.

This type of machine is very suitable when all steps of the process have approximately the same duration, but if the duration of one of the steps is considerably longer than that of the others—which is generally the case—the step in question will determine the kinetics of the whole sequence and therefore the productivity of the machine. Consequently, these machines have only been used on a very limited scale.

The object of the invention is to overcome these drawbacks in a simple, reliable, effective and rational way.

The problem which the invention is intended to resolve is that of providing continuous treatment of different substrates, particularly in the case of vacuum deposition of a metal, with the objective, on the one hand, of being able to regulate the rate of treatment not on the basis of the longest time but on the basis of the shortest time, which will clearly enable the duration of the whole treatment to be reduced considerably, and, on the other hand, of having a high degree of flexibility in operation, by creating a treatment assembly which is modular, instead of being fixed like the technical solutions used at present.

SUMMARY OF THE INVENTION

To resolve this problem and achieve these objectives, an installation consisting of a plurality of identical independent modules, aligned and communicating with each other, has been devised and developed. Each module is itself made up of a treatment chamber and a transfer chamber.

Advantageously, but not exclusively, the treatment chamber is located above the transfer chamber with which it communicates via a vacuum-tight door which can be folded away by any suitable means to allow the transfer of the parts to be treated from one chamber to the next.

According to another characteristic of the invention, the different modules are aligned in such a way that they communicate with each other by means of transfer chambers, with two consecutive transfer chambers possibly, but not necessarily, being separated by a door.

According to the fundamental characteristics of the invention, the parts to be treated can move successively from any treatment chamber to any other, without passing through the adjacent treatment chamber, thus eliminating the principal drawback of conventional in-line machines.

In a preferred, but not exclusive, embodiment of the invention, in order to resolve the problem posed of easily transferring the substrate from one module to the next and of placing the substrate in the vacuum treatment chamber in question, the transfer means comprise two positively driven endless belts or chains, fitted with projections for interacting with complementary shapes on a substrate support, a platform being fitted between said belts and being controlled by elements for moving it vertically toward the vacuum treatment chamber, thereby transferring the substrate into said chamber.

To resolve the problem posed of permitting the easy transfer of the substrate from one module to the next, the platform is positioned, during the linear movement of the substrate support and the substrate from one module to the next, under the plane defined by the driving projections of the endless belts or chains.

In the upper position of the platform, in which the substrate is introduced into the vacuum treatment chamber, the platform acts as a sealing door for the vacuum treatment chamber. In this position, the substrates placed on their support can be driven at all times by the projections of the endless belts or chains, being moved under the platform which is placed, as mentioned, in a position to form a sealed closure of the vacuum treatment chamber in question.

To resolve the problem posed of introducing the substrate into the vacuum treatment chamber in question, the elements for moving the platform vertically consist of a set of links and bent levers controlled by at least one actuating member of the jack type.

In view of the distinctive design of each module, the level having the transfer means forms a support structure incorporating said means in its lower part, while its upper part has a support plane for the sealed fixing of the vacuum treatment chamber, said plane having an opening for the engagement of the substrate.

To resolve the problem posed of creating a vacuum in the whole installation consisting of the desired number of modules, the part of each module receiving the transfer means consists of a sealed enclosure in which a vacuum can be created, a vacuum being created simultaneously in the different enclosures after a plurality of modules have been joined together.

BRIEF DESCRIPTION OF THE DRAWINGS

The invention is described more fully below with the aid of the figures on the attached drawings, in which:

FIGS. 3, 4, 5 and 6 are perspective views of an embodiment of a module showing the principle of movement and transfer of the substrate.

DETAILED DESCRIPTION OF PREFERRED EMBODIMENTS

Figure 1:
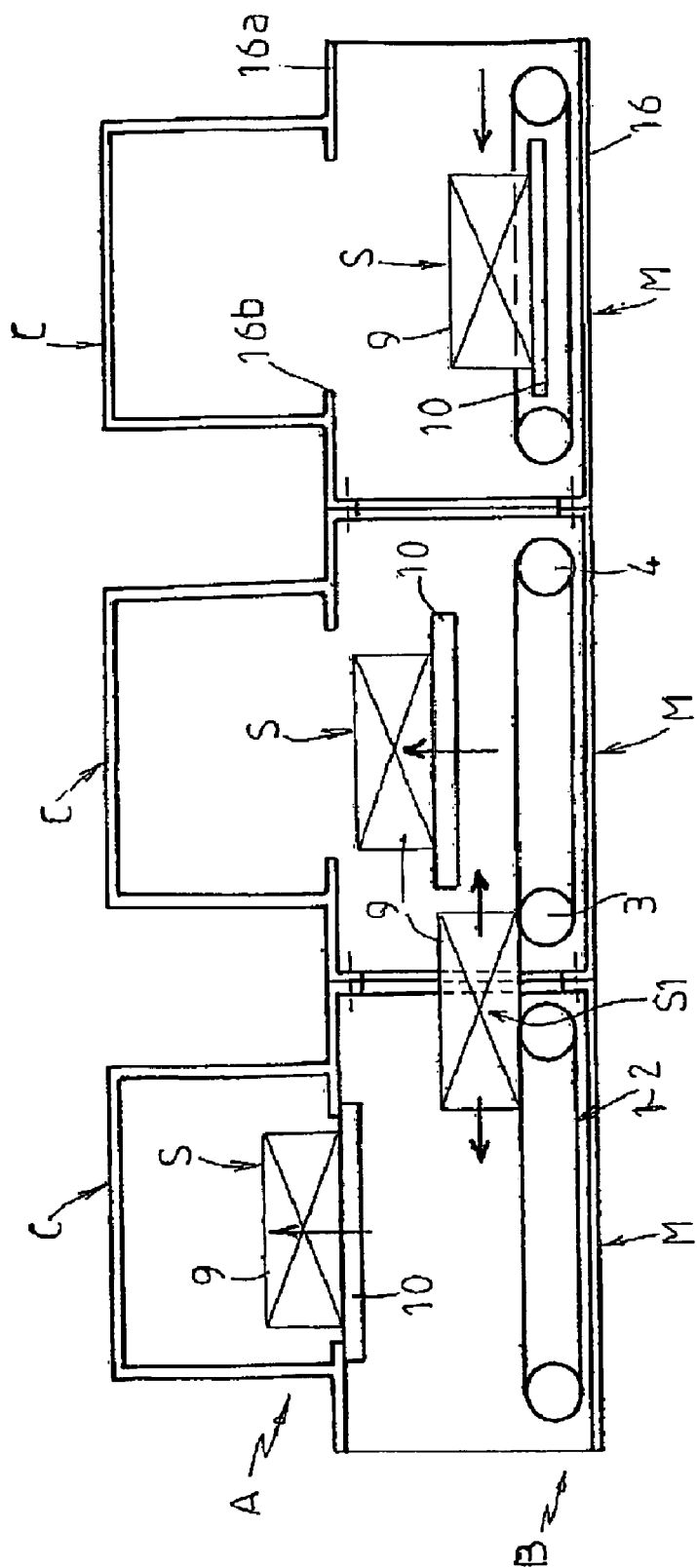
FIG. 1 is a purely schematic view showing the operating principle of the treatment installation according to the invention.
Figure 2:
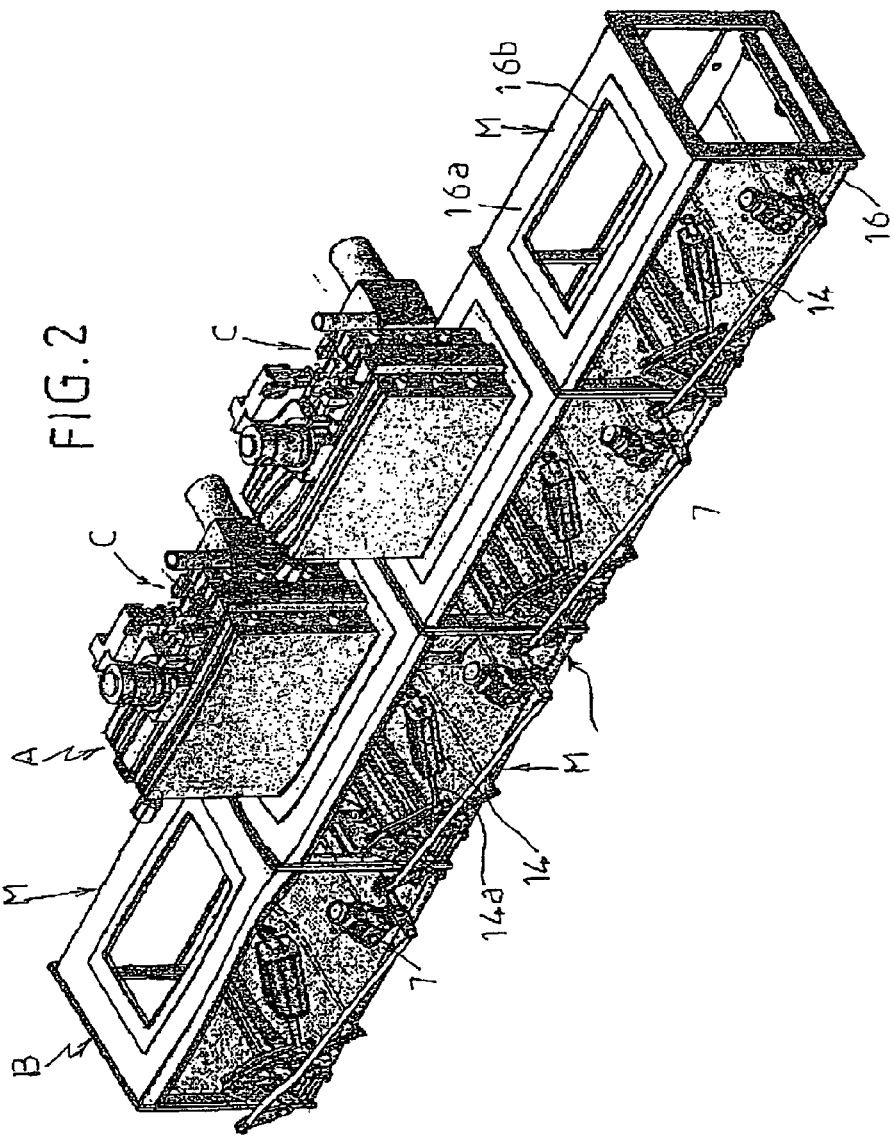
FIG. 2 is a perspective view of an example of embodiment of the installation formed by the joining of a plurality of adjacent modules.

According to a fundamental characteristic of the invention, the installation consists of a plurality of independent and aligned modules which are indicated as a whole by (M). Each module (M) is identical as regards its principle and consists of two aligned levels (A) and (B), one being superimposed on the other.

For example, the upper level (A) has a vacuum treatment chamber (C) while the lower level (B) acts as the transfer chamber, and has means for transferring the substrate (S) within one of the different chambers (C) or from one chamber to another located downstream or upstream, directly next to it or separated by at least one module.

The design of each module (M), and particularly of their transfer means, is determined in such a way that, while a substrate is in one chamber for a specific treatment, another substrate can be transferred into another chamber to undergo another treatment.

As indicated in the description below, the different modules (M) are designed to be juxtaposed and aligned so that they are in communication. The transfer means of two adjacent modules are also designed to provide, in combination, the transfer of the substrates (S) from one module to the next. After juxtaposition, the different modules (M), particularly in their lower levels (B), can be joined together by any appropriate known means, particularly by simple screw connections.

For each module, the transfer means comprise two positively driven parallel endless belts or chains (1) and (2). For example, the belts (1) and (2) interact with driving wheels (3) and (4) joined in pairs by common connecting shafts (5) and (6). The connecting shaft (5) is fitted freely in bearings, while the connecting shaft (6) is connected to a motor member (7). Clearly, the example described and illustrated for the driving of the endless belts (1) and (2) is provided for guidance only and is not restrictive.

Each belt (1) and (2) is fitted with projections (8) which face each other and point into the space delimited by said belts (1) and (2). These projections (8) are intended to interact with complementary shapes (9a) formed in a substrate support (9). For example, this substrate support (9) consists of a simple horizontal plate. The complementary shapes (9a) consist of notches. In the attached drawings, the substrate, or the batch of substrates to be treated, is represented by a parallelepiped body.

It will be seen that these arrangements permit the linear movement of the substrate (S) placed on the support (9) whose notches (9a) interact with the projections (8). After the joining and juxtaposition of a plurality of modules, the substrate (S) can easily be moved from one module to another, in a specified direction of movement, and can be moved back again by reversing the direction of rotation of the motor (7) for example.

A platform (10) is fitted between the belts (1) and (2) and is controlled by elements for moving it vertically, and particularly for elevating it, toward the vacuum treatment chamber (C), thereby transferring the substrate/on the support (9), into said chamber (C).

For example, the platform (10) is supported by a frame (11) which delimits each side of said platform (10) two spaces (11a) and (11b) formed in parallel to permit the incorporation and passage of the endless belts (1) and (2).

For example/the frame (11) is controlled by a set of links (12) and levers (13), said levers being pivoted at each end of the longitudinal sides of the frame (11) and on a fixed part of the chassis of each module, while the links (12) are pivoted on the levers (13), in combination with rollers (18) interacting with the frame (11) for example.

The set of links (12) and bent levers (13) is controlled, for example, by a jack (14) in particular, pivoted on a fixed part of the chassis of each module to permit, by means of the movement of its rod (14a), the guided vertical movement, both upward and downward, of the assembly consisting of the frame (11) and the platform (10).

In the lower position, the platform (10) is positioned below the upper plane defined by the projections of the endless driving belts or chains (1) and (2). In this lower position, the assembly consisting of the support and the substrate (S) can be transferred smoothly without the interference of the platform (10). In its upper position, the platform (10) acts as a sealing door for the vacuum treatment chamber in question.

The different movement and transfer means for the support (9) of the substrate (S) are fitted on the lower level, for example. Each module (M) consists of a structure (16) combined with running members (15). For example, the structure (16) forms a box of generally parallelepiped shape. If necessary, the upper part of the structure can have a supporting plane (16b) for the sealed fixing of the vacuum treatment chamber proper (C). The supporting plane has an opening (16a) for the engagement of the assembly consisting of the support (9) and substrate (S). This communication opening (16a) between the lower level (B) and the upper level (A) is blocked, during the treatment of the substrates (S), in a sealed way by the platform (10) which acts as the support for the assembly consisting of the plate (9) and substrate (8).

The structure (16) of the lower level (B) of each module, which receives the movement and transfer means, forms a sealed box or enclosure in which a vacuum can be created. After a plurality of modules has been joined together, a vacuum is created simultaneously in the different enclosures (16) by any appropriate means known to those skilled in the art.

Reference should be made to FIGS. 3, 4, 5 and 6, which show, for one module, the principle of linear movement of the substrate from one module to the next and its transfer to the level of the vacuum treatment chamber in question.

FIG. 3 shows a module with the platform (10) in the lower position, between the two endless belts or chains (1) and (2), and located under the upper plane formed by the driving projections of said belts (1) and (2). The substrate (S), placed on a support (9), is shown at the entry to the treatment module in question.

In FIG. 4, the assembly consisting of the plate (9) and substrate (S) interacts by means of the notches (9a) with the driving projections (8), the substrate assembly being moved linearly by the endless belts (1) and (2), the platform (10) still being located in the lower part in order not to interfere with the linear movement of the substrate assembly. When the substrate assembly is positioned opposite and in alignment with the opening (16b) of the vacuum treatment chamber in question, the actuating jack (14) acts on the set of links (12) and bent levers (13), thereby causing the vertical movement of the platform (10) together with the support plate (9) and the substrate (S) (FIGS. 5 and 6).

In the upper position (FIG. 6), the platform (10) forms a sealed closure of the opening (16a) of the vacuum treatment chamber.

It is important to note that, while the platform is in this upper position, other substrates can be moved linearly from one module to the next while another module is carrying out a treatment (substrate (S1), FIG. 1).

Clearly, the various actuating means for moving and transferring the substrate in the aforementioned conditions can be controlled by any type of programmable controller, according to the treatment cycle in question. The different modules are all identical, with the exception of certain accessories of the treatment enclosures which are specific to any given treatment.

Because of these arrangements, by contrast with the prior art solutions, if the treatment time of one module is relatively long this will not in itself decrease the whole of the treatment cycle. For example, in the case of a substrate requiring a plurality of 10-minute treatments and one 30-minute treatment, according to the invention, in order to manage the treatment time corresponding to 30 minutes, the installation will be provided, for this treatment time of 30 minutes, with three strictly identical modules, in such a way that the resulting treatment time is 10 minutes per input. Consequently, the treatment rate of the whole system is determined by the shortest treatment time rather than by the longest treatment time.

The advantages are made clear by the description.

We claim:

1. An installation for vacuum treatment of substrates including
    a plurality of aligned independent modules, each independent module of the plurality comprising a vacuum treatment chamber and a transfer chamber,
    each transfer chamber of an independent module including
        first transfer means for transferring a substrate bi-directionally vertically between the transfer chamber and the vacuum chamber of the module, and
        second transfer means for transferring the substrate bi-directionally horizontally from the transfer station of the module to a transfer station of a different module,
    wherein, in each independent module, the first transfer means is configured to permit transfer of a second substrate by the second transfer means of the module when the first transfer means has transferred the substrate to the vacuum treatment chamber of the module, and
    wherein the second transfer means of each independent module is adapted to be operated independent of second transfer means of other modules of the plurality,
    a controller for operating the second transfer means of the plurality of independent modules to selectively transfer the substrate from an independent module in a downstream direction or an upstream direction to an adjacent module or to a remote module of the plurality in a single transfer step in accordance with a predetermined processing schedule; and
    wherein the vacuum treatment chamber of each independent module is vertically spaced from, and vertically aligned relative to, the transfer chamber of each independent module.

2. The installation of claim 1 wherein the vacuum chamber of each independent module is located under the transfer chamber of each independent module.

3. An installation for vacuum treatment of substrates including
    a plurality of aligned independent modules, each independent module of the plurality comprising a vacuum treatment chamber and a transfer chamber,
    each transfer chamber of an independent module including
        first transfer means for transferring a substrate bi-directionally vertically between the transfer chamber and the vacuum chamber of the module, and
        second transfer means for transferring the substrate bi-directionally horizontally from the transfer station of the module to a transfer station of a different module,
    wherein, in each independent module, the first transfer means is configured to permit transfer of a second substrate by the second transfer means of the module when the first transfer means has transferred the substrate to the vacuum treatment chamber of the module, and
    wherein the second transfer means of each independent module is adapted to be operated independent of second transfer means of other modules of the plurality,
    a controller for operating the second transfer means of the plurality of independent modules to selectively transfer the substrate from an independent module in a downstream direction or an upstream direction to an adjacent module or to a remote module of the plurality in a single transfer step in accordance with a predetermined processing schedule; and
    wherein the vacuum treatment chamber of each independent module is located on top of, and vertically aligned relative to, the transfer chamber of each independent module.

4. The installation as claimed in claim 3, wherein the vacuum treatment chamber and the transfer chamber of each independent module are superimposed and aligned.

5. The installation as claimed in claim 4, wherein transfer chambers of the plurality of independent modules are juxtaposed and aligned to be in communication.

6. The installation as claimed in claim 3, wherein the second transfer means comprise two positively driven endless belts or chains, fitted with projections for interacting with complementary shapes on a substrate support, and said first transfer means comprises a platform fitted between said belts and being controlled by elements for moving the platform vertically and elevating the platform toward the vacuum treatment chamber, thereby transferring the substrate into said vacuum treatment chamber.

7. The installation as claimed in claim 6, wherein the platform is positioned, during transfer of the substrate support and the substrate by the second transfer means, under a plane defined by the projections of the endless driving belts or chains.

8. The installation as claimed in claim 6, wherein the platform acts as a sealing door for the vacuum treatment chamber.

9. The installation as claimed in claim 6, wherein the elements for moving the platform vertically comprise a set of connecting rods and bent levers fitted with at least one cylinder type control component.

10. The installation as claimed in claim 3, wherein the transfer chamber includes a support structure incorporating said first transfer means in a lower part, while an upper part has a support plane for sealed fixing of the vacuum treatment chamber, said plane having an opening for engagement of the substrate.

11. The installation as claimed in claim 3, wherein the transfer chamber of each independent module comprises a sealed enclosure in which a vacuum can be created, and further comprising means for simultaneously creating a vacuum in the transfer chambers of different modules after a plurality of modules have been joined together.

* * * * *